United States Patent

Ota et al.

[11] Patent Number: 5,160,849
[45] Date of Patent: Nov. 3, 1992

[54] DIFFRACTION-TYPE DISPLACEMENT DETECTOR FOR ALIGNMENT OF MASK AND WAFER

[75] Inventors: Kazuya Ota, Tokyo; Nobutaka Magome, Kawasaki, both of Japan

[73] Assignee: Nikon Corporation, Tokyo, Japan

[21] Appl. No.: 642,384

[22] Filed: Jan. 17, 1991

[30] Foreign Application Priority Data

Jan. 22, 1990 [JP] Japan ................... 2-12322

[51] Int. Cl.⁵ .......................................... G01N 21/86
[52] U.S. Cl. ..................................... 250/548; 356/401
[58] Field of Search ............... 356/400, 401, 356, 363; 250/548, 557

[56] References Cited

U.S. PATENT DOCUMENTS

| | | | |
|---|---|---|---|
| 4,710,026 | 12/1987 | Magome et al. | 356/349 |
| 4,828,392 | 5/1989 | Nomura et al. | 356/401 |
| 4,870,289 | 9/1989 | Sato et al. | 356/400 |

FOREIGN PATENT DOCUMENTS 63-283129 11/1988 Japan.

*Primary Examiner*—David C. Nelms
*Assistant Examiner*—T. Davenport
*Attorney, Agent, or Firm*—Shapiro and Shapiro

[57] ABSTRACT

A displacement detector comprises a beam irradiation device for irradiating beams almost equal in wavelength on a diffraction grating provided on an object to be measured from two directions different each other, a photoelectric detector for detecting an interference intensity of specific diffracted rays generated from the diffraction grating, and a measuring device for measuring a displacement of the object to be measured with reference to a grating pitch direction of the diffraction grating according to an outgoing signal of the photoelectric detector; the photoelectric detector is equipped with a first photoelectric detector for detecting an interference intensity of diffracted rays of an angle of diffraction running in the said direction from the diffraction grating, and a second photoelectric detector for detecting an interference intensity of diffracted rays different in angle of diffraction running in the same direction from the diffraction grating; the measuring device has a first measuring portion for measuring a value corresponding to a displacement of the object to be measured according to an outgoing signal of the first photoelectric detector, and a second measuring portion for measuring a value corresponding to a displacement of the object to be measured according to an outgoing signal of the second photoelectric detector, outputting at least one mean value of the measured value of the first measuring portion and the measured value of the second measuring portion.

7 Claims, 10 Drawing Sheets

DIFFRACTION-TYPE DISPLACEMENT DETECTOR FOR ALIGNMENT OF MASK AND WAFER

BACKGROUND OF THE INVENTION

1. Field of the Invention

The present invention relates to a high resolution displacement detector utilizing a diffraction grating, and is particularly concerned with a device for detecting a dislocation of the diffraction grating formed on wafer, mask and the like, or an alignment error arising between the mask and the wafer.

2. Related Background Art

As disclosed in U.S. Pat. No. 4,828,392, this kind of displacement detector includes a system known hitherto such that a diffraction grating is formed on a substrate such as wafer or the like, interference fringes are formed in line in a pitch direction of the diffraction grating by applying coherent two luminous fluxes thereto from the direction different each other, and a displacement and dislocation of the diffraction grating are detected with reference to the static interference fringes. Further, the aforementioned patent discloses that when edges of each element of the diffraction grating on the substrate are symmetric, intensities of diffracted rays from the diffraction grating are obtained on various degrees individually beforehand to a data base, and an error due to the asymmetry is corrected according to the data base at the time when the dislocation is detected practically.

Further, a method for detecting a dislocation of the diffraction grating on light heterodyne system by flowing interference fringes irradiated on the diffraction grating at high speed in one direction is also disclosed, for example, in U.S. Pat. No. 4,710,026. According to the art disclosed in the patent, a constant frequency difference is provided to coherent two luminous fluxes, and the two luminous fluxes are crossed on the diffraction grating at a predetermined angle, thereby obtaining the interference fringes flowing in one direction at a velocity according to the frequency difference. Then, when detecting the dislocation, an interference intensity of the diffracted beams of a degree generated in the same direction from the diffraction grating is detected photoelectrically, and thus a measuring photoelectric signal of the frequency equal to a frequency difference of the two luminous fluxes is obtained. On the other hand, a reference signal of the frequency equal to a frequency difference of the two luminous fluxes is prepared separately, a phase difference of the measuring photoelectric signal to the reference signal is detected, thereby measuring a dislocation (displacement) of the diffraction grating in a pitch direction within $\pm\frac{1}{4}$ pitches of the grating.

Further, that for which a dislocation detector of such light heterodyne system is incorporated as TTR (through-the-reticle) alignment system in a projection exposure device (stepper) for manufacturing semiconductor elements is disclosed in Japanese Patent Application Laid-open No. 63-283129. With one shot domain on the wafer aligned to a projected image of a reticle pattern at $\pm 1$ $\mu$m or so, the TTR alignment system is normally used such that a grating mark of the shot domain is detected to obtain a dislocation coming 1 $\mu$m or below, and a wafer stage or a reticle stage is moved fine so that the dislocation is corrected. Thus, in the TTR alignment system, the two luminous fluxes and the wafer (grating mark) do not move relatively with each other when detecting the grating mark, however, an interference fringe on the grating mark keeps flowing at all times, therefore the phase difference can be measured successively.

In case the wafer is subjected to measurement, the wafer in an exposure process has a resist layer applied normally on overall surface thereof.

Accordingly, the diffraction grating mark on the wafer surface will be irradiated. The resist layer is thin at 1 $\mu$m or so, however, a laser beam or the like with fine monochromatism is used for the two luminous fluxes, therefore there may be a case where an intensity of the diffracted beam ($\pm$primary light, for example) generated from the grating mark changes to excess due to a slight change in thickness of the resist layer. Further, in the wafer and others subjected to a series of process, a duty (ratio of line width to space width) of the grating mark itself may change from 50%, therefore an intensity of the diffracted beam ($\pm$primary light) to detect changes in this case.

A further defect is such that when influences of both the resist layer and grating duty, are an unfavorable appropriate detectable intensity of the diffracted beam (interference ray of $\pm$primary lights) is almost not obtainable.

SUMMARY OF THE INVENTION

Now, therefore, an object of the present invention is to provide a detector capable of detecting a displacement of the diffraction grating despite arising of the aforementioned unfavorable influence.

The present invention is applicable to either system known hitherto, that is, the homodyne system for detecting a displacement of the diffraction grating with reference to static fringes generated by two luminous fluxes intersecting each other, and the heterodyne system for detecting a displacement of the diffraction grating by the phase difference between a frequency difference provided to the two luminous fluxes and a reference signal.

As in the case of prior art, a basic construction of the present invention comprises beam irradiation means for irradiating beams of light on the diffraction grating from two directions, photoelectric detection means for detecting an interference intensity of the diffracted rays generated from the diffraction grating, measuring means for measuring a displacement of the diffraction grating in a pitch direction according to signals generated therefrom. Further, as a novel construction of the present invention, a first photoelectric detector and a second photoelectric detector are provided to operate as the photoelectric detection means.

The first photoelectric detector comprises detecting an interference intensity of the diffracted rays of a diffraction angle generated from the diffraction grating by irradiating two beams, and the second photoelectric detector comprises detecting an interference intensity of the diffracted rays different in diffraction angle generated from the diffraction grating.

Further, a first measuring portion and a second measuring portion are provided to operate as the measuring means in the present invention. The first measuring portion measures a value corresponding to a displacement (or dislocation) of the diffraction grating (object to be measured) according to signals generated by the first photoelectric detector, and the second measuring portion measures a value corresponding to a displacement (or dislocation) of the diffraction grating according to signals generated by the second photoelectric detector.

Then, the construction is such that a mean value of either one or both of a measured value of the first measuring portion and a measured value of the second measuring portion is selected according to a magnitude of each outgoing signal of the photoelectric detector.

The first photoelectric detector of the present invention detects an interference intensity of the diffracted rays of a diffraction angle, however, this may be attained, when two beams of light irradiating the diffraction grating from two directions are separated as a first beam and a second beam, by determining a relation between an incident angle on the diffraction grating and a grating pitch of the two beams of light so that −primary diffracted ray generated, for example, by irradiation of the first beam and +primary diffracted ray generated by irradiation of the second beam will run in the same direction. Then, if the condition is satisfied, a zero order diffracted ray (positive reflected light or straight transmitted light) generated, for example, by irradiation of the first beam, and +secondary diffracted ray generated by the second beam run in the same direction, which is detected by the second photoelectric detector as an interference intensity. In view of the point that a probability whereat the condition for the primary diffracted ray to be diminished for the influence of duty of the diffraction grating, resist layer and others and the condition for the secondary diffracted ray to be diminished are satisfied concurrently is extremely small, the present invention is therefore to detect a displacement (dislocation) of the diffraction grating by using the one outgoing signal, if a sufficient intensity is obtained on either one of the photoelectric detectors. Accordingly, a dislocation is normally detected according to an interference intensity of the diffracted rays of an order number (±primary), and when the interference intensity comes below a predetermined level or is totally not obtainable, the dislocation is then detected otherwise according to an interference intensity of the diffracted rays different each other in order number (zero order, secondary), thereby enhancing a detection rate of the diffraction rating mark securely.

Here, a principle of the present invention will be described with reference to FIG. 2 and FIG. 3.

In FIG. 2, two beams of light $BM_1$, $BM_2$ are irradiated symmetrically at an incident angle $\phi$ on a reflective diffraction grating GA.

The first beam $BM_1$ and the second beam $BM_2$ are irradiated from the same laser beam source, and parallel to have a sectional area wide enough to irradiate an overall surface of the grating GA, both. Further, frequencies of the first beam $BM_1$ and the second beam $BM_2$ are equal, however, even if there is a difference present therebetween, the following description also applies likewise.

Then, the frequency difference refers to a beat frequency of the light heterodyne system, which can be provided easily by using Zeeman laser beam source. Further, that frequencies of the first beam $BM_1$ and the second beam $BM_2$ are different is not necessarily to signify that wavelengths are different, which may be taken rather equal substantially. The heterodyne beat frequency referred to in the present invention is lower ($10^3$ to $10^5$ Hz or so) than a radio frequency, and hence can be neglected apparently as compared, for example, with an absolute frequency (light speed/wavelength) being about $4.76 \times 10^{14}$ Hz of a typical wavelength 628 nm of He-Ne laser beam.

Now, as illustrated in FIG. 2, when the two beams $BM_1$, $BM_2$ are irradiated, interference fringes IF are produced in the intersection domain. The interference fringes IF are set to be parallel with elements of the grating GA. Here, if a wavelength of the two beams $BM_1$, $BM_2$ is $\lambda$, a pitch of the grating GA (duty being 50%) is Pg, and a pitch of the interference fringes IF is Pf, the following relation holds first:

$$Pf = \frac{\lambda}{2 \sin \psi} \quad (1)$$

Further, if each n-order diffracted ray of the first beam $BM_1$ and the second beam $BM_2$ is generated vertically to a plane of the grating GA, the following relation may hold:

$$\sin \phi = \frac{n \cdot \lambda}{Pg} \quad (2)$$

Accordingly, $2 \cdot n \cdot Pf = Pg$ from Eqs. (1), (2). It is indicated as $n=1$ in FIG. 2, and a higher order diffracted ray extending clockwise to the 0-order diffracted ray is indicated as positive, and that of extending counterclockwise is indicated as negative.

First a 0-order diffracted ray $B_1$ (0) produced by irradiation of the first beam $BM_1$ runs backward through the same optical path as the second beam $BM_2$. Then a −primary diffracted ray $B_1$ (−1) produced by irradiation of the first beam $BM_1$ runs vertically, and a −secondary diffracted ray $B_1$ (−2) runs backward through an optical path almost same as the first beam $BM_1$. Further, a +primary diffracted ray $B_1$ (+1) produced by irradiation of the first beam $BM_1$ runs in the direction inclined almost by an angle $\phi$ clockwise from the 0-order diffracted ray $BM_1$ (0), and a −tertiary diffracted ray $B_1$ (−3) runs in the direction inclined almost by the angle $\phi$ counterclockwise from the first beam $BM_1$. On the other hand, a 0-order diffracted ray $B_2$ (0) produced by irradiation of the second beam $BM_2$ runs backward through the same optical path as first beam $BM_1$. Then a +primary diffracted ray $B_2$ (+1) produced by irradiation of the second beam $BM_2$ runs vertically, and a +secondary diffracted ray $B_2$ (+2) runs backward through an optical path almost same as the second beam $BM_2$. Further, a −primary diffracted ray $B_2$ (−1) produced by irradiation of the second beam $BM_2$ runs in the direction inclined almost by the angle $\phi$ counterclockwise from the 0-order diffracted ray $B_2$ (0), and a +tertiary diffracted ray $B_2$ (+3) runs in the direction inlined almost by the angle $\phi$ clockwise from the second beam $BM_2$. Accordingly, if the +primary diffracted rays $B_1$ (−1) and $B_2$ (+1) are conditioned to arise in the same direction, then the 0-order diffracted ray $B_1$ (0) and the +secondary diffracted ray $B_2$ (+2) come in the same direction, and the 0-order diffracted ray $B_2$ (0) and the −secondary diffracted ray $B_1$ (−2) come in the same direction. Further the +primary diffracted ray $B_1$ (+1) and the +tertiary diffracted ray $B_2$ (+3) come in the same direction, and the −primary diffracted ray $B_2$ (−1) and the −tertiary diffracted ray $B_1$ (−3) come in the same direction.

These diffracted rays running in the same direction come to interfere with each other, and the interference intensity changes into a sine wave form according to a relative move of the interference fringes and the grating GA.

FIG. 3A and FIG. 3B show how each diffracted ray is generated when the two beams $BM_1$, $BM_2$ are irradiated on the grating GA separately, wherein the axis of ordinate indicates a relative intensity of the diffracted rays, and the axis of abscissa indicates a grating angle of each diffracted ray with a normal direction of the grating GA as zero norm.

In this connection, the +secondary diffracted ray $B_1$ (+2), the +tertiary diffracted ray $B_1$ (+3) in FIG. 3A, and the −secondary diffracted ray $B_2$ (−2), the −tertiary diffracted ray $B_2$ (−3) in FIG. 3B are not indicated in FIG. 2.

As will be apparent from FIG. 3A and FIG. 3B, those in which an absolute value of the difference between a degree of the diffracted rays generated by the first beam $BM_1$ and a degree of the diffracted rays generated by the second beam $BM_2$ becomes 2 run mutually in the same direction and come to interfere with each other. That is, when ±n-order diffracted rays are adjusted to run in the same direction, the diffracted rays of the degree with an absolute value of the difference as 2n will run in the same direction.

In the present invention, a plurality of interference lights of the diffracted rays of the degree with an absolute value of the difference as 2n are detected individually, and which outgoing signal to use for detecting dislocations is decided according to the signal intensity.

DESCRIPTION OF THE PREFERRED EMBODIMENTS

Figure 1:
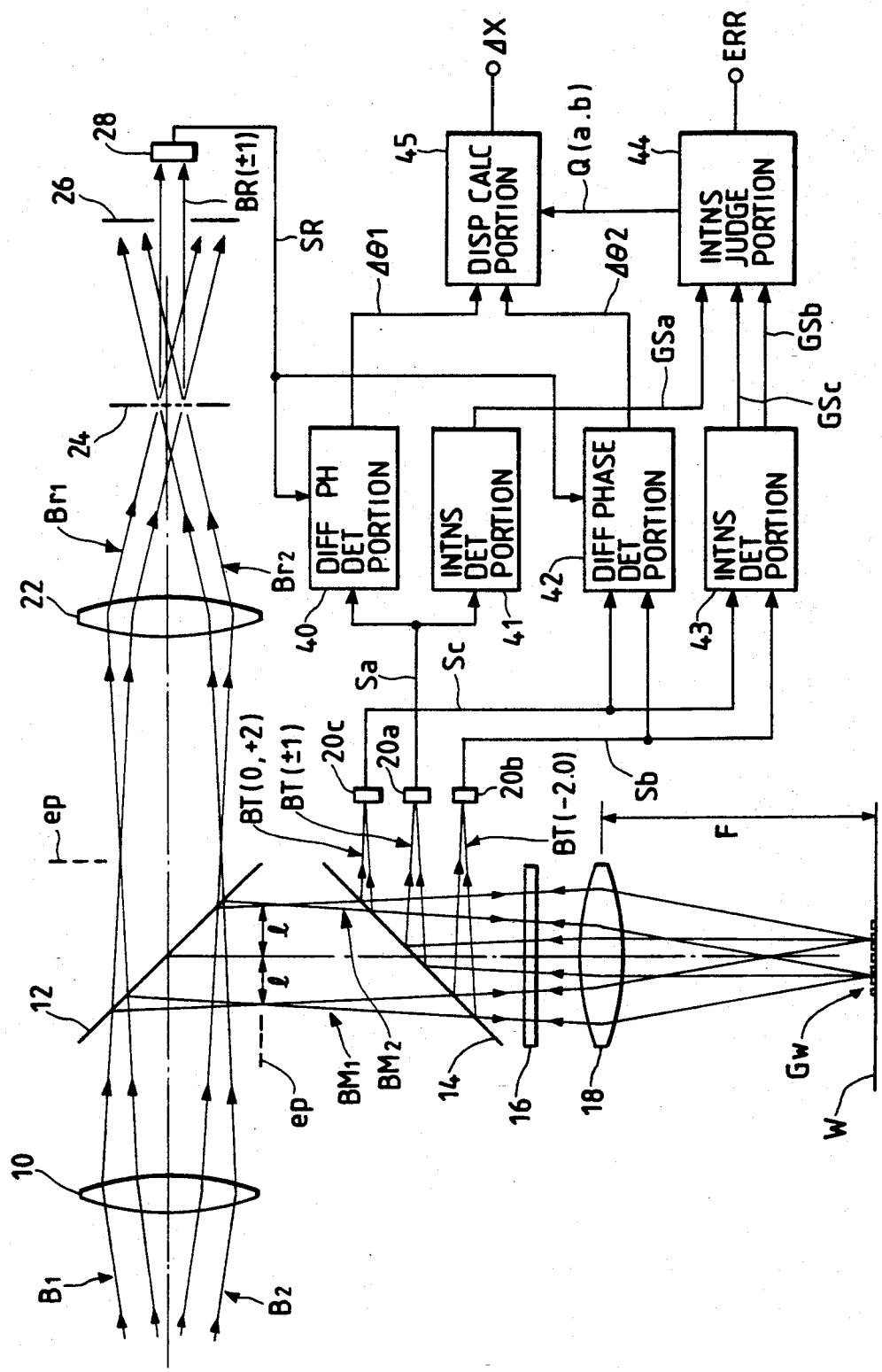
FIG. 1 is a drawing illustrating a construction of a displacement detector according to a first embodiment of the present invention.

FIG. 1 shows a construction of a displacement detector according to a first embodiment of the present invention, wherein exemplified is a case where a displacement of a diffraction grating Gw formed on a semiconductor wafer W is detected within ±¼ of a grating pitch Pg.

A basic construction of the optical system shown in FIG. 1 is equivalent to that of having been disclosed, for example, in Japanese Patent Application Laid-open No. 63-283129. Two parallel beams $B_1$, $B_2$ are lights polarized linearly in the same direction, have a frequency difference Δf (100 K Hz or below, for example), and are condensed by a lens system 10. The beams $B_1$, $B_2$ are divided into beams $BM_1$, $BM_2$ incident on the wafer W by a polarizing neutral beam splitter 12 and beams $Br_1$, $Br_2$ incident on a reference system. The beams $BM_1$, $BM_2$ further transmit almost 100% through a polarized beam splitter 14, incident on a ¼ wavelength plate 16, pass through a telecentric objective lens system 18, and intersect as parallel beams on the wafer W.

A secondary focal point plane of the lens system 10 coincides with a primary focal point plane of the objective lens system 18, namely a pupil ep, and the two beams $BM_1$, $BM_2$ are condensed on a minimum spot at points symmetric with reference to an optical axis within the pupil ep. Further, main rays of the beams $BM_1$, $BM_2$ are almost parallel with the optical axis in a pupil space (between the lens system 10 and the objective lens system 18). Accordingly, the beams $BM_1$ $BM_2$ running toward the wafer W from the objective lens system 18 become parallel and incline symmetrically each other at an incident angle φ. In the present embodiment, since the wafer W is disposed to coincide with the secondary focal point plane of the objective lens system 18, if the focal length is F, and a distance from the optical axis of a beam spot in the pupil ep is l, the incident angle φ can be expressed as:

$$\tan \phi = l/F \quad (3)$$

Figure 2:
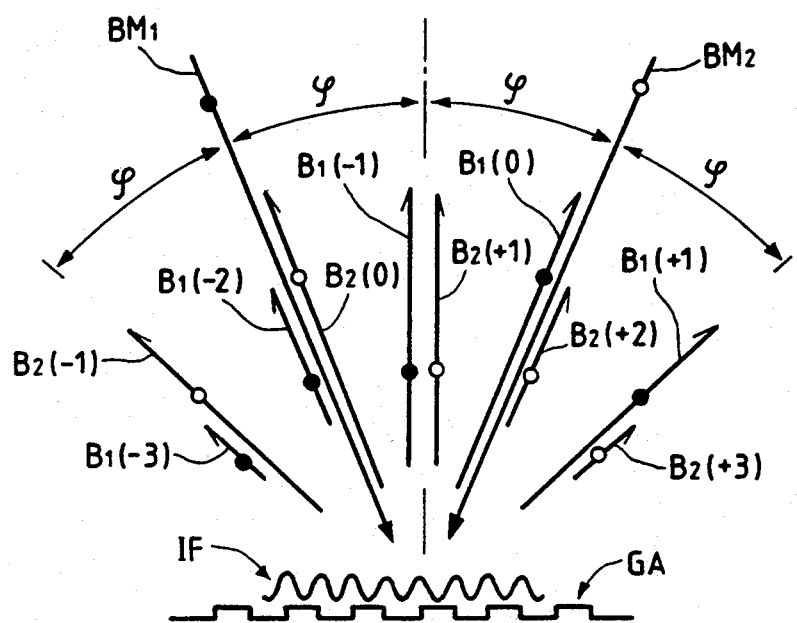
FIG. 2 is a drawing showing how diffracted rays are generated for illustrating a principle of the present invention.

Then, the beams $BM_1$, $BM_2$ having passed the polarized beam splitter 14 are, for example, lights polarized linearly P, and when incident on the wafer W by the ¼ wavelength plate 16, they become circular polarized rays with the polarized planes rotated in the same direction, and come to interfere with each other. Thus interference fringes in pitch Pf flow on the diffraction grating Gw at a constant rate, and as illustrated in FIG. 2, the ±primary diffracted rays return vertically to the wafer W along the optical axis of the objective lens system 18. The ±primary diffracted rays from the grating Gw become interference rays BT (±1) interfering with each other to pass the ¼ wavelength plate 16, where they are transformed from circular polarized rays into lights polarized linearly S, reflected almost 100% on the polarized beam splitter 14, and received by a photoelectric element 20a. The photoelectric element 20a is disposed at a position of the pupil of the objective lens system 18 or on the optical axis thereabouts. The ±primary diffracted rays from the grating Gw of the wafer W are parallel beams both, therefore interference rays BT (±1) are condensed to a minimum spot size at a position of the photoelectric element 20a.

Similarly, the interference rays BT $(-2, 0)$, BT $(0, +2)$ generated in the direction running backward through an optical path of the beams $BM_1$, $BM_2$ from the grating Gw are also transformed from circular polarized light into S polarized light by the ¼ wavelength plate 16, reflected by the polarized beam splitter 14, and then received by photoelectric elements $20b$, $20c$ respectively. The photoelectric elements $20b$, $20c$ are disposed on the pupil of the objective lens system 18 or thereabouts to hold the photoelectric element $20a$ therebetween.

On the other hand, the two beams $Br_1$, $Br_2$ divided by the beam splitter 12 are transformed into parallel beams intersecting on a reference grating 24 by a lens system 22. A primary focal point plane of the lens system 22 coincides with a secondary focal point plane of the lens system 10, and the reference grating 24 coincides with a secondary focal point plane of the lens system 22. The reference grating 24 is a transmission type, a 0-order beam from here is interrupted by an aperture 26, and only ±primary diffracted rays BR ($\pm 1$) running coaxially are received by a photoelectric element 28 by way of the aperture 26.

The two beams $Br_1$, $Br_2$ intersecting at the reference grating 24 are both lights polarized linearly P, therefore interfere with each other, and flowing interference fringes are produced on the reference grating 24. The reference grating 24 functions as a reference point on a device side when a displacement is detected, and is fixed stably within the device.

Now, since the beams $B_1$, $B_2$ have a frequency difference $\Delta f$ therebetween, the interference rays BR ($\pm 1$) from the reference grating 24 and the interference rays BT ($\pm 1$), BT ($-2, 0$), BT ($0, +2$) from the grating Gw change all into a sine wave form in intensity on the beat frequency $\Delta f$. Accordingly, if the photoelectric elements $20a$, $20b$, $20c$ and 28 have a reply efficiency satisfactory enough to follow the beat frequency $\Delta f$, these photoelectric elements generate sine wave signals Sa, Sb, Sc, SR of the frequency $\Delta f$ respectively.

The outgoing signal Sa is inputted to a phase difference detecting portion 40 for detecting a phase difference $\Delta \theta_1$ against the outgoing signal SR as a reference, and an intensity detecting portion 41 for detecting an intensity of the outgoing signal Sa, or a value GSa relating to amplitude.

The outgoing signals Sb, Sc are inputted to a phase difference detecting portion 42 for detecting a phase difference $\Delta \theta_2$ to the outgoing signal SR, and an intensity detecting portion 43 for detecting intensities of the signals Sb, Sc, or values GSb, GSc relating to amplitude individually. The phase difference detecting portion 42 obtains a phase difference $\Delta \theta b$ between the outgoing signal Sb and the reference signal SR, a phase difference $\Delta \theta c$ between the outgoing signal Sc and the reference signal SR individually, and then obtains the phase difference $\Delta \theta_2$ from the following calculation:

$$\Delta \theta_2 = (\Delta \theta b + \Delta \theta c)/2 \tag{4}$$

An intensity judging portion 44 inputs the values GSb, GSc relating to intensities of the interference rays BT $(-2, 0)$, $(0, +2)$, carries out the following calculation for example, thereby obtaining the mean intensity GU:

$$GU = (GSb + GSc)/2 \tag{5}$$

Further the intensity judging portion 44 generates a judging output Q (a, b) to a displacement calculating portion 45 according to a relation between the intensity values GSa and GU in magnitude, and generates an error signal ERR when neither of the intensity values GSa, GU satisfy predetermined conditions.

The displacement calculating portion 45 inputs the phase differences $\Delta \theta_1$, $\Delta \theta_2$, and obtains a dislocation (displacement) $\Delta X$ to the reference grating 24 of the diffraction grating Gw within $\pm \frac{1}{4}$ of the grating pitch Pg through the following equation:

$$\Delta \theta = \frac{a \cdot \Delta \theta_1 + b \cdot \Delta \theta_2}{a + b} \tag{6}$$

$$\Delta X = \frac{Pg/2}{2\pi} \cdot \Delta \theta \tag{7}$$

(where $0 \leq a \leq 1$, $0 \leq b \leq 1$)

The coefficients a, b in Fq. (6) are set according to the judging output Q (a, b) from the intensity judging portion 44, and some judging algorithms are prepared therefor.

Now, typical three algorithms incorporated in the intensity judging portion 44 will be exemplified as follows.

Then, in Eq. (7), $-\pi < \Delta \theta < \pi$, therefore $-Pg/4 < \Delta X < Pg/4$.

First algorithm

IF GSa > GU THEN a = 1, b = 0
IF GSa < GU THEN a = 0, b = 1

Second algorithm

Using a preset signal intensity value $g_0$:
IF GSa > $g_0$ THEN a = 1, b = 0
IF GSa < $g_0$ THEN a = 0, b = 1

Third algorithm a = $C_1$·GSa, b = $C_2$·GU ($C_1$, $C_2$ being constants)

The first algorithm is a method wherein intensities of the interference rays BT ($\pm 1$) of the primary diffracted rays and a mean intensity of the interference rays BT $(-2, 0)$, $(0, +2)$ of the 0-order diffracted rays are compared with each other, and the phase difference $\Delta \theta$ and the displacement $\Delta X$ are obtained according only to the signal with larger intensity. The second algorithm is a method wherein signal Sa (phase difference $\Delta \theta_1$) of the interference rays BT ($\pm 1$) is used fundamentally, and only when the intensity value GSa comes lower than the level $g_0$, the signals Sb, Sc (phase difference $\Delta \theta_2$) are used. The third algorithm is a method wherein a specific gravity is provided to each of the phase differences $\Delta \theta_1$ and $\Delta \theta_2$ according to the intensity values GSa, GU, and both the phase differences $\Delta \theta_1$ and $\Delta \theta_2$ are used at all times. These three typical algorithms are selected properly according to a duty of the diffraction grating Gw on the wafer W and a change in thickness and others of the resist layer, and what is best in precision may be used. Practically, the precision will be ensured by confirming the state of a grating mark beforehand through a visual observation on microscope or TV, or as a result of carrying out a test printing with the wafer W aligned therefor.

In the above-described construction of the present embodiment, in case a difference in the intensity values GSb, GSc of the two interference rays $(-2, 0)$, $(0, +2)$ is extremely large, or the intensity value of either one is almost zero, and further the intensity value GSa of the outgoing signal Sa is insufficient for displacement detection, the intensity judging portion 44 generates the error signal ERR to give operators a warning.

Figure 3A:
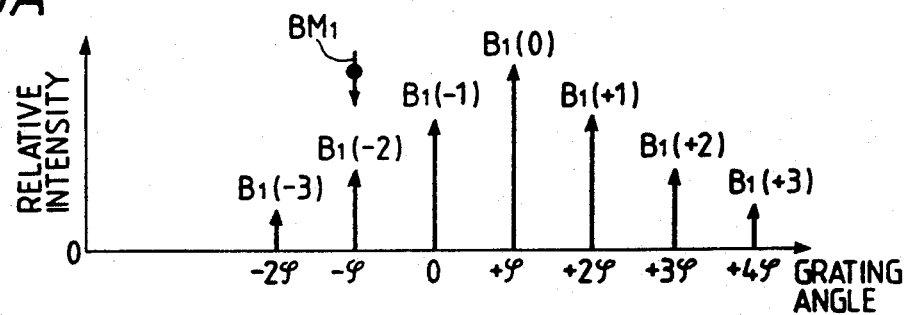
FIGS. 3A and 3B are graphs indicating a grating angle of the diffracted rays in FIG. 2.
Figure 3B:
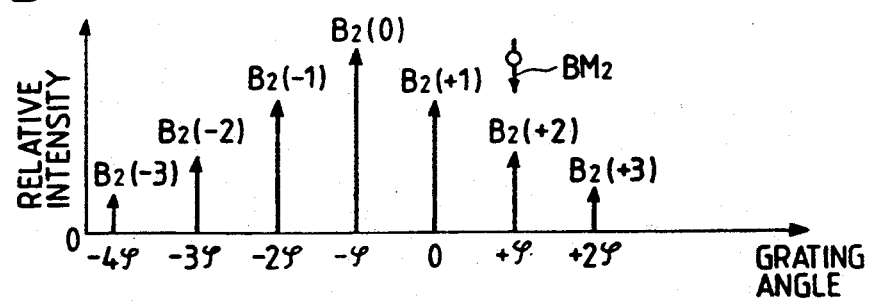

Then, it is desirable that the intensity detecting portions 41, 43 detect an amplitude of the signal. For example, the diffracted rays of a degree are of an intensity provided that intensities of the two beams $BM_1$, $BM_2$ are almost equal, accordingly a modulation degree of the signal amplitude will be 100% ideally. However, in the case of diffracted rays different theoretically as shown in FIG. 3, a modulation degree of the signal amplitude will never be 100%.

Figure 4A:
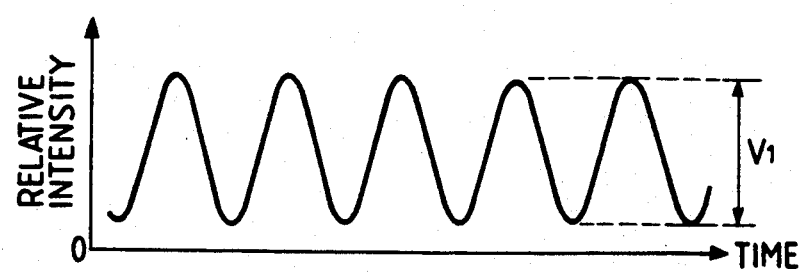
FIGS. 4A and 4B are drawings showing a waveform of each photoelectric signal.
Figure 4B:
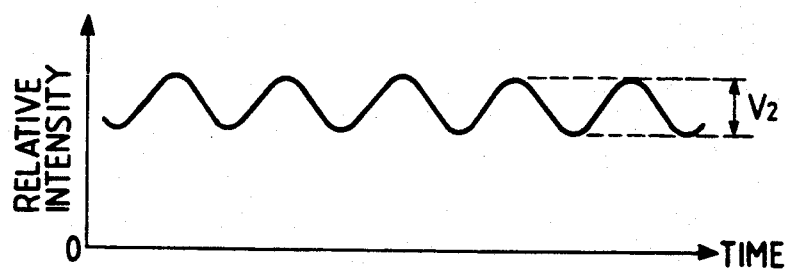

FIGS. 4A and 4B show how the signal amplitudes modulate typically, wherein FIG. 4A exemplifies a waveform of the signal Sa corresponding to a time change in intensity of the interference rays BT (±1), and FIG. 4B exemplifies a waveform of the signal Sb (or Sc) corresponding to a time change in intensity of the interference rays BT (−2, 0), (0, +2). Reference characters $V_1$, $V_2$ denote amplitudes, and in the case of the interference rays BT (±1) of ±primary diffracted rays, the modulation degree (amplitude/mean value, or AC/DC) is large, but the modulation degree in the case of 0-order and secondary interference rays becomes small. However, the modulation degree, or the absolute value of amplitude changes sensitively due to a form of the grating mark Gw and an influence of the resist layer. Accordingly, a displacement is detected normally by means of interference rays of the diffracted rays of a degree generated at diffraction angles symmetrical with reference to the optical axis, and when an amplitude of change in intensity of the interference rays deteriorates along with the modulation degree, the interference rays BT (−2, 0), (0, +2) of the diffracted rays different in degree are ensured, but if the amplitude is sufficient, then it is desirable that the mode will be changed to utilize the interference rays, that is the second algorithm will be preferred.

Meanwhile, the description has referred to such that the phase difference detecting portion 42 in FIG. 1 obtains the phase differences $\Delta\theta b$, $\Delta\theta c$ to each reference signal SR of the outgoing signals Sb, Sc, and outputs the simple mean value $\Delta\theta_2$, however, a disadvantage may arise practically as it stands.

A phase difference to the reference signal SR of the interference rays BT (±1) of the ±primary diffracted rays is $\Delta\theta_1$, however, attention will be turned to phase differences $\Delta\theta_{b-1}$, $\Delta\theta_{c-1}$ between it and the aforementioned phase differences $\Delta\theta_b$, $\Delta\theta_c$.

Here, $\Delta\theta_{b-1} = \Delta\theta_b - \Delta\theta_1$, $\Delta\theta_{c-1} = \Delta\theta_c - \Delta\theta_1$, and these phase differences $\Delta\theta_{b-1}$, $\Delta\theta_{c-1}$ are capable of changing between −180° to +180° due to a drop in level of the grating mark Gw on the wafer W, duty, resist thickness and others. However, if every grating elements of the grating mark Gw are made almost symmetrical in the direction where displacement is detected (or in the direction where diffracted rays are generated), then $\Delta\theta_{b-1} \approx \Delta\theta_{c-1}$. Now, therefore, suppose, for example, there present is a grating mark to be $\Delta\theta_{b-1} = +170°$, $\Delta\theta_{c-1} = -170°$ when the displacement is zero ($\Delta\theta_1 = 0°$). In this case, a displacement happens to arise on the grating mark, thus resulting in $\Delta\theta_1 = +30°$.

Figure 5:
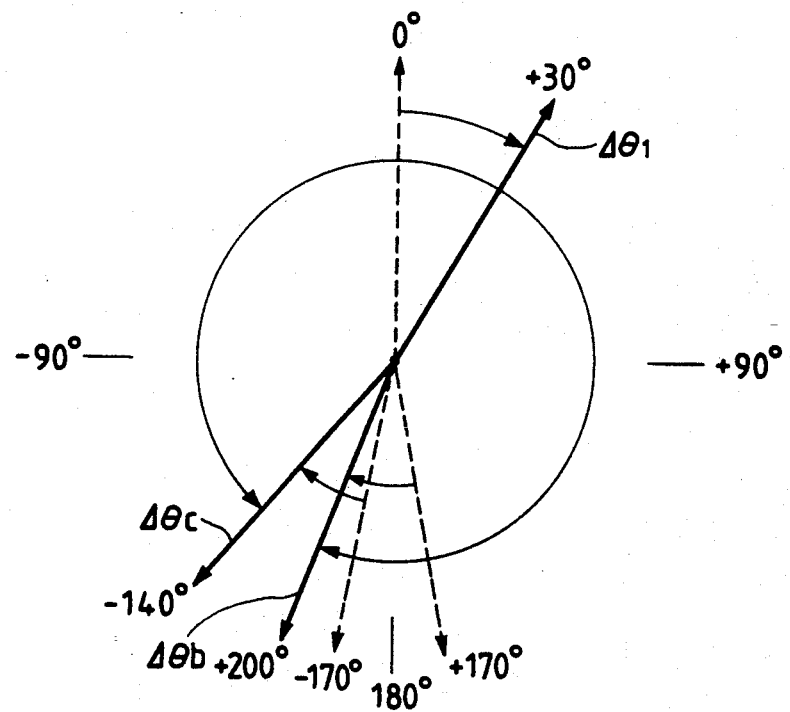
FIG. 5 is a drawing for illustrating a phase shifting of photoelectric signals of three interference lights to a reference signal.

FIG. 5 is a vector diagram illustrating the circumstances, wherein positive comes clockwise, and negative comes counterclockwise.

In this case, correct values of the phase differences $\Delta\theta_b$, $\Delta\theta_c$ are $\Delta\theta_b = +200°$, $\Delta\theta_c = -140°$, and thus $\Delta\theta_2 = (\Delta\theta_b + \Delta\theta_c)/2 = 30° = \Delta\theta_1$. However, the phase difference cannot be detected generally at −180° to +180°, therefore $\Delta\theta_b = +200°$ is measured as $\Delta\theta_b = -160°$. Accordingly, when the phase difference $\Delta\theta_2$ is obtained through a simple addition averaging, $\Delta\theta_2 = (\Delta\theta_b + \Delta\theta_c)/2 = (-160 - 140)/2 = -150°$, thus obtaining such value as is totally different from $\Delta\theta_1 = 30°$.

Figure 6:
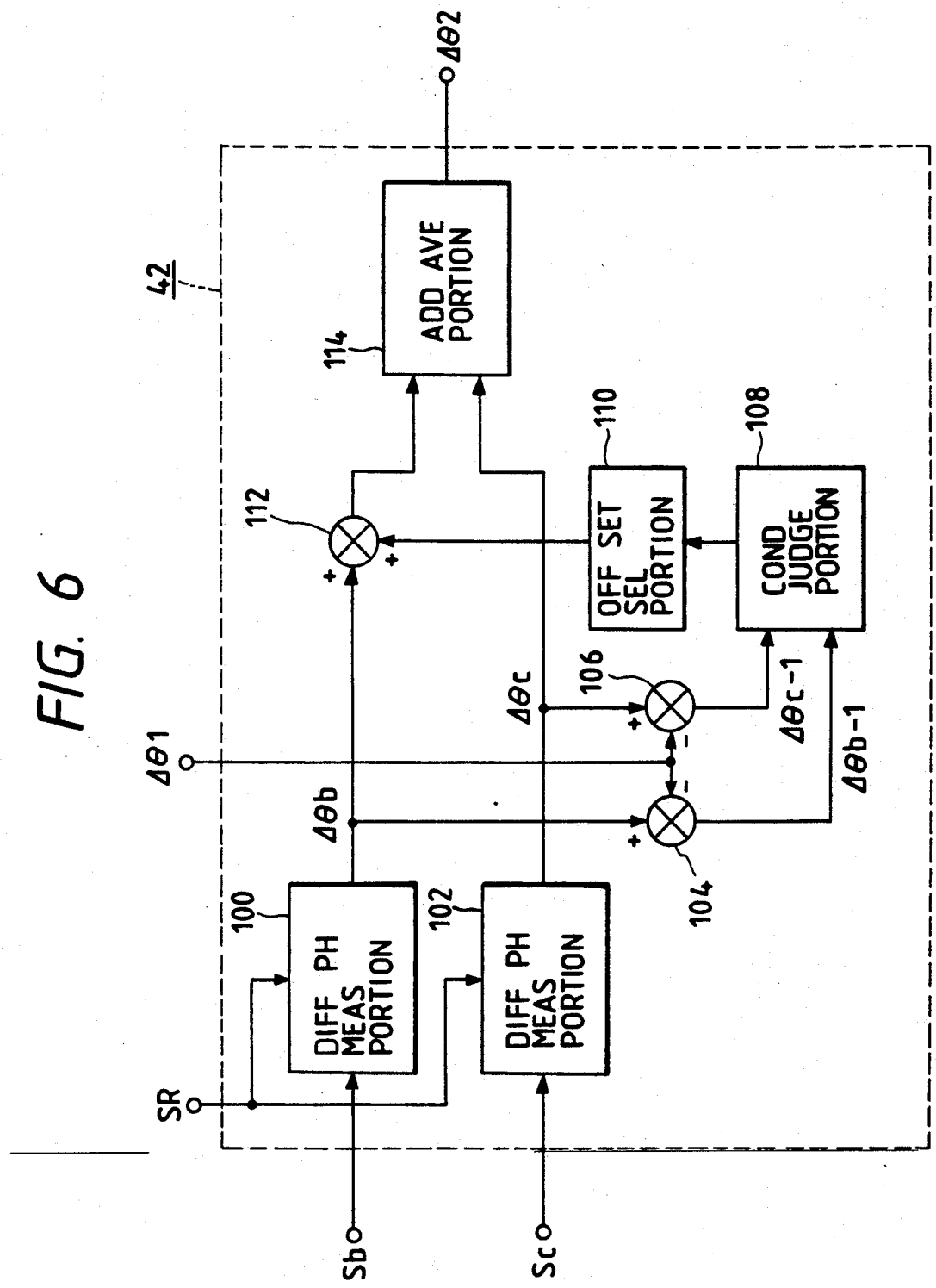
FIG. 6 is a diagram exemplifying a phase difference detecting portion used in the first embodiment.

However, when $\Delta\theta_{b-1} \approx \Delta\theta_{c-1}$ is premised, a correction may be effected by the phase difference detecting portion 42. Consequently, an internal construction of the phase difference detecting portion 42 is, for example, as shown in FIG. 6. The construction of FIG. 6 is realized practically by an arithmetic program of computer and others, however, it is given typically in the form of circuit block.

In FIG. 6, the signal Sb of the interference rays BT (−2, 0) and the signal Sc of the interference rays BT (0, +2) are inputted to phase difference measuring portions 100, 102 respectively, and the phase differences $\Delta\theta_b$, $\Delta\theta_c$ from the reference signal SR are obtained. The phase difference measuring portions 100, 102 may operate on either a hardware processing or a software processing using a waveform memory, detecting phase difference within ±180°.

The phase differences $\Delta\theta_b$, $\Delta\theta_c$ are sent to subtracters 104, 106 respectively, the subtracter 104 obtains the difference $\Delta\theta_{b-1}$ between $\Delta\theta_b$ and $\Delta\theta_1$ (output of the phase detecting portion 40), and the subtracter 106 obtains the difference $\Delta\theta_{c-1}$ between $\Delta\theta_c$ and $\Delta\theta_1$. A condition judging portion 108 decides whether or not the differences $\Delta\theta_{b-1}$ and $\Delta\theta_{c-1}$ satisfy the condition $\Delta\theta_{b-1} \approx \Delta\theta_{c-1}$, and determines any one of the three output data of an offset selecting portion 110 according to the result obtained therethrough. The offset selecting portion 110 has three offset values of 0°, +360°, −360° as output data, and sends any one of these values to an adder 112. The adder 112 adds the phase difference $\Delta\theta_b$ and the offset value to output to an addition averaging portion 114. The addition averaging portion 114 obtains a mean value from adding the offset phase difference $\Delta\theta_b$ and the phase difference $\Delta\theta_c$ from the phase difference measuring portion 102, and outputs a phase difference $\Delta\theta_2$ when interference rays of the ±secondary diffracted ray and the 0-order diffracted ray are utilized. An operation of the block of FIG. 6 will now be described by means of the numeric values exemplified hereinbefore.

First as illustrated in FIG. 5, if $\Delta\theta_1 = 30°$, then the phase difference $\Delta\theta_b$ measured by the phase difference measuring portion 100 is −160° (or +200° correctly), and the phase difference $\Delta\theta_c$ measured by the phase difference measuring portion 102 is −140°. Thus the output value $\Delta\theta_{b-1}$ of the subtracter 104 will be −190°, and the output value $\Delta\theta_{c-1}$ of the subtracter 106 will be −170°. The condition judging portion 108 has a function to add, for example, $\Delta\theta b - 1$ and $\Delta\theta_{c-1}$, and if the added value is almost zero, then $\Delta\theta_{b-1} \approx \Delta\theta_{c-1}$ is judged to be true. Here, $\Delta\theta_{b-1} + \Delta\theta_{c-1} \approx -360°$ to be negative, therefore the judging portion 106 sets the offset selecting portion 110 to output the offset value +360°.

Accordingly, the adder 112 adds the offset value +360° and the phase difference $\Delta\theta_b$ (−160°), and outputs a correct value of phase difference being +200°. Then, when a calculation of $\Delta\theta_{b-1} + \Delta\theta_{c-1}$ results almost zero, the offset value is 0°, but when results in a positive value, the offset value is selected at −360°.

Further, the adder 112 may add an output side of the phase difference measuring portion 102, namely the phase difference $\Delta\theta_c$ and the offset value. In this case, the offset value +360° is added to $\Delta\theta_c$ (−140°) to be +220°, however, it is calculated as $\Delta\theta_2 \approx 30°$ likewise by the addition averaging portion 114.

The above refers to the ideal case where premised as $\Delta\theta_1 = (\Delta\theta_b + \Delta\theta_c)/2$. Supposing that such ideal state holds is most cases, the construction according to the present invention will be unnecessary.

However, in a practical wafer processing, $\Delta\theta_1 \neq (\Delta\theta_b + \Delta\theta_c)/2$ normally, therefore the technique shown in FIG. 6 is not necessarily to ensure success.

For example, in the numeric values exemplified previously, with $\Delta\theta_b$ (−160°), $\Delta\theta_c$ (−140°) as they stand, when only $\Delta\theta_1$ is detected as −150° (or +30° correctly) for accidental and extreme error:

$$\Delta\theta_{b-1} = -10°, \Delta\nu_{c-1} = +10°,$$

and thus the condition $\Delta\theta_{b-1} \approx -\Delta\theta_{c-1}$ will be satisfied, therefore an accurate displacement cannot be obtained.

However, a probability that such extreme and big error may arise is excessively low, therefore it is effective that a correction be applied to $\Delta\theta_b$, $\Delta\theta_c$ by the technique shown in FIG. 6.

Figure 7:
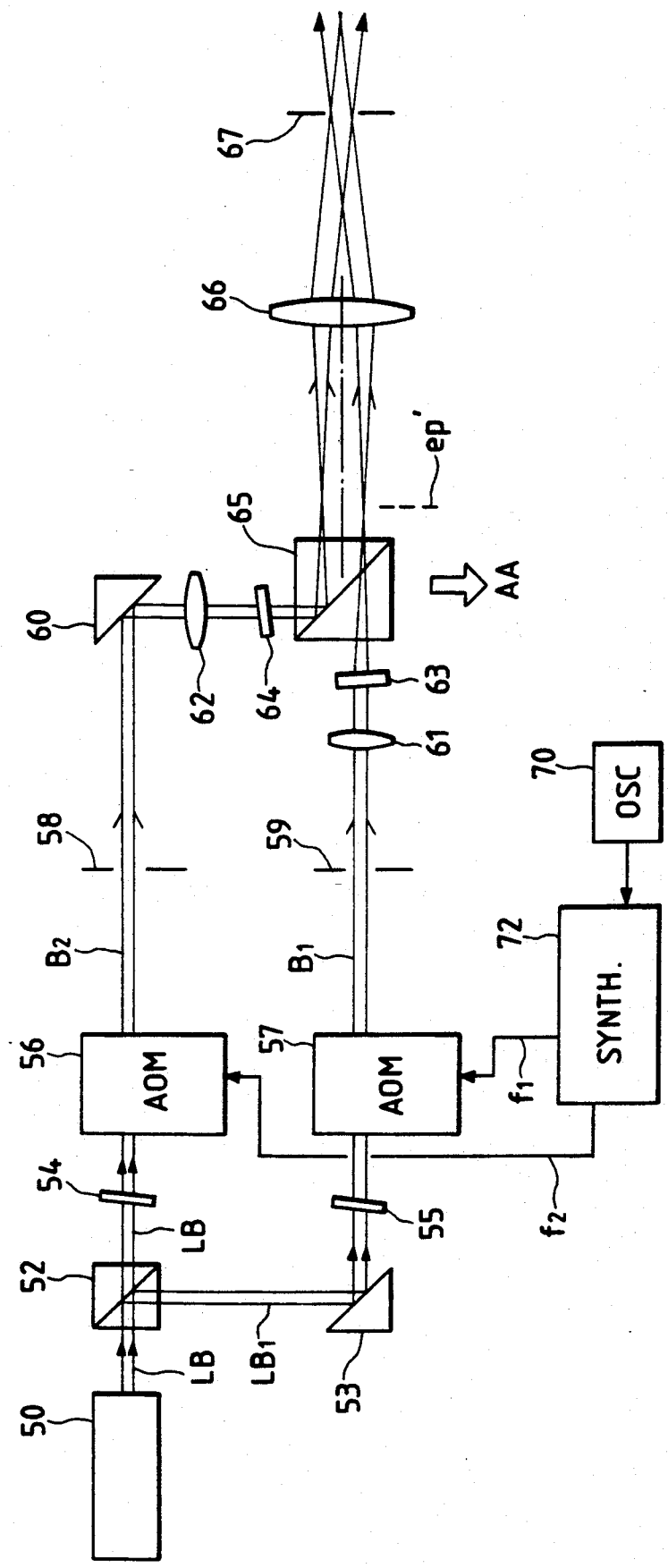
FIG. 7 is a drawing showing a construction of a beam transmission system applied to the detector of FIG. 1.

FIG. 7 exemplifies a system for feeding the two beams $B_1$, $B_2$ to the detector of FIG. 1, where a laser beam source of linear polarization is used. A laser beam LB from a laser beam source 50 is divided into beams $LB_1$, $LB_2$ by a beam splitter 52, the beam $LB_1$ is reflected by a mirror 53, and incident on a frequency shifter (acoustic optical modulator: AOM) 57 through a parallel plane glass (plane parallel) 55. The other beam $LB_2$ is incident on a frequency shifter (AOM) 56 through a plane parallel 54. AOM's 57, 56 are driven on a high-frequency drive signal generated by a high-frequency oscillator 70, a frequency synthesizer 72 and others, a driving frequency $f_1$ for AOM 57 is, for example, 80.0 M Hz, and a driving frequency $f_2$ for AOM 56 is, for example, 80.050 M Hz. AOM's 57, 56 emit a 0-order ray and a higher order diffracted ray of the incident beams $LB_1$, $LB_2$, and apertures 58, 59 are provided so as to extract the primary diffracted ray only as the beams $B_1$, $B_2$.

A frequency of the beam $B_1$ having passed through the aperture 59 is $f_0 + f_1$ with a frequency of the original laser beam LB as $f_0$.

The beam $B_1$ paralleled hitherto is converged by a lens system 61, and condensed on a pupil conjugate plane ep' as a spotlight through a plane parallel 63 and a beam splitter 65. On the other hand, a frequency of the beam $B_2$ having passed through the aperture 58 is $f_0 + f_2$, converged by a lens system 62, and condensed on the pupil conjugate plane ep' as a spotlight through a plane parallel 64 and the beam splitter 65.

Here the two beams $B_1$, $B_2$ are not synthesized coaxially by the beam splitter 65 but synthesized eccentrically so as to be symmetrical with reference to an optical axis of a lens system 66 and also to have main rays of the beams positioned in parallel with the optical axis. A primary focal point of the lens system 66 coincides with the pupil conjugate plane ep', and the two beams $B_1$, $B_2$ become paralleled to intersect on a parallellogrammic aperture (visual field diaphragm) 67 disposed as a secondary focal point of the lens system 66.

A position of the aperture 67 coincides with a primary focal point of the lens system 10 in FIG. 1. Accordingly, the pupil conjugate plane ep' is conjugate with the pupil ep in FIG. 1. Here, a frequency difference between the two beams $B_1$, $B_2$ is $(f_0 + f_2) - (f_0 + f_1) = 80.05$ M Hz $- 80.0$ M Hz $= 50$ K Hz, which works as a heterodyne beat frequency. In the above-described construction, angles and positions of the beams $LB_1$, $LB_2$ incident on AOM's 56, 57 can be optimized by changing inclinations of the plane parallel 54, 55, and an interval (l in FIG. 1) of the two beams $B_1$, $B_2$ at the pupil conjugate plane ep' or the pupil ep, that is, intersecting angles and incident angles of the two beams on an object surface and an image surface can be adjusted by changing inclinations of the plane parallels 63, 64. Further, the aperture 67 is formed into a parallelogram so as not to leave an opening edge extending in the direction orthogonal to a grating pitch direction of the diffraction grating Gw, thereby preventing an influence of diffraction (Fraunhofer's diffraction) due to an edge of the aperture 67 from being exerted on a light receiving system.

Meanwhile, when using the light sending system shown in FIG. 7, the lens system 22, the reference grating 24, the aperture 26 and the photoelectric element 28 will be disposed on the other beam emitting plane of the beam splitter 65, that is, in the direction indicated by an arrow AA, and the beam splitter 12 may be replaced by a total reflecting mirror.

As described above, according to the method for generating the beat frequency $\Delta f(f_1 - f_2)$ by means of the two AOM's 56, 57, an optimum beat frequency adaptable to reply efficiency of each photoelectric element is obtainable because the frequency $\Delta f$ can be changed arbitrarily. Further, a disadvantage that two beams having a frequency difference exist coaxially like Zeeman laser beam source can be avoided, therefore an advantage will be ensured such that a generation of noise component (AC signal having a beat frequency) due to unnecessary stray beam, crosstalk and others can be minimized.

A second embodiment of the present invention will be described next with reference to FIG. 8, which exemplifies a variant of the light sending system shown in FIG. 7.

Figure 8:
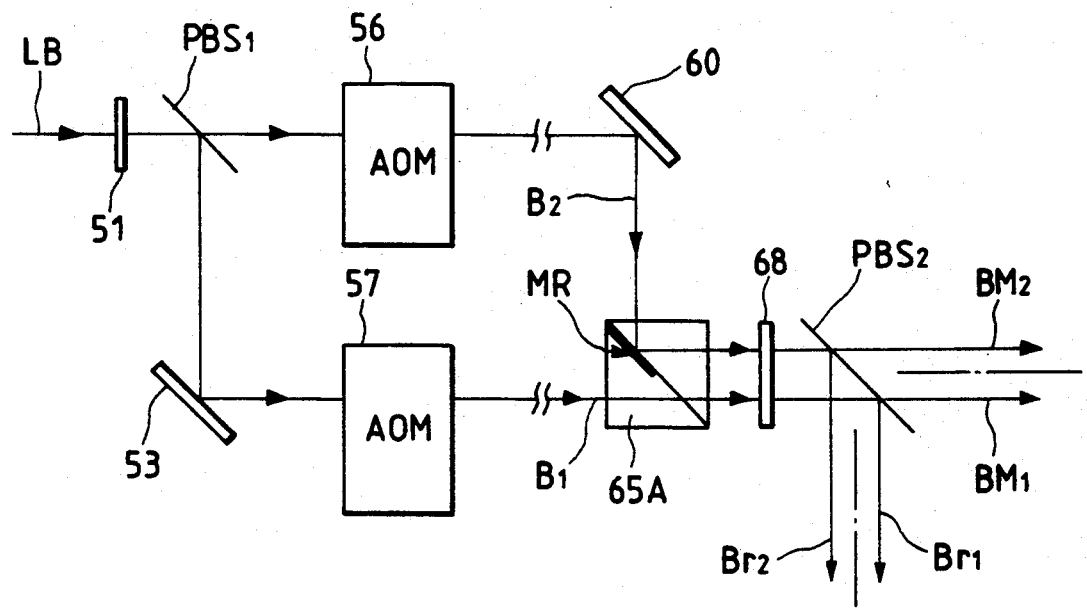
FIG. 8 is an optical drawing exemplifying a variant of the beam transmission system applied to the detector of FIG. 1, representing a second embodiment of the present invention.

In FIG. 8, the apertures 58, 59, the lens systems 61, 62, the plane parallels 54, 55, 63, 64 in FIG. 7 are provided similarly, however, the illustration is omitted therein.

The laser beam LB of linear polarization is incident on a ½ wavelength plate 51 for rotating a plane of polarization almost by 45°, and is then divided into a P polarized beam and an S polarized beam by a polarized beam splitter $PBS_1$. The P polarized beam is shifted by the frequency $f_1$ on the AOM 56 to be the beam $B_2$ and reaches a plane of total reflection MR of a composite prism 65A. On the other hand, the S polarized beam is reflected by the mirror 53 and incident on the AOM 57, shifted by the frequency $f_2$ to be the beam $B_1$ and passes through the composite prism 65A. The composite prism 65A synthesizes the beams $B_1$, $B_2$ so as to parallel the main rays at predetermined intervals. The beams $B_1$, $B_2$ pass through a ½ wavelength plate 68 for rotating a plane of polarization almost by 45° and are incident on a polarized beam splitter $PBS_2$. The polarized beam splitter $PBS_2$ resolves the S polarized beam $B_1$ vectorially into an S polarized beam $Br_1$ and a P polarized beam $BM_1$, and also resolves the P polarized beam $B_2$ vectorially into an S polarized beam $Br_2$ and a P polarized beam $BM_2$. These beams $Br_1$, $Br_2$ run toward the reference system (from the lens system 22 and on in FIG. 1), and the beams $BM_1$, $BM_2$ run toward the detection system (from the polarized beam splitter 14 on in FIG. 1).

Such light sending system construction may lead to an advantage that an availability of the beams is enhance better than that of FIG. 7, further a light quantity ratio of the two beams $B_1$, $B_2$ can be adjusted correctly at 1 to 1, and a light quantity ratio of the $Br_1$, $Br_2$ running toward the reference system to the beams $BM_1$, $BM_2$ running toward the detection system can be set arbitrarily.

First, for adjustment of an intensity ratio of the beams $B_1$, $B_2$, the ½ wavelength plate 51 may be rotated fine round the axis parallel with the laser beam LB. A light quantity ratio of the beams $Br_1$, $Br_2$ and a light quantity ratio of the beams $BM_1$, $BM_2$ are then adjusted at the same time, and intensities of the two beams for irradiating the reference grating 24 and the diffraction grating Gw can be equalized accurately. Further, from rotating the ½ wavelength plate 68 fine round the optical axis, a relative split ratio of the beams $Br_1$, $Br_2$ and the beams $BM_1$, $BM_2$ can be changed, and it is advisable to feed a light little to the reference system superior in stability and also to feed a light much to the detection system for object to be measured such as wafer W or the like for signal detection. In the example of FIG. 8, the advantage is such that an intensity of each beam can be adjusted simply.

Figure 9:
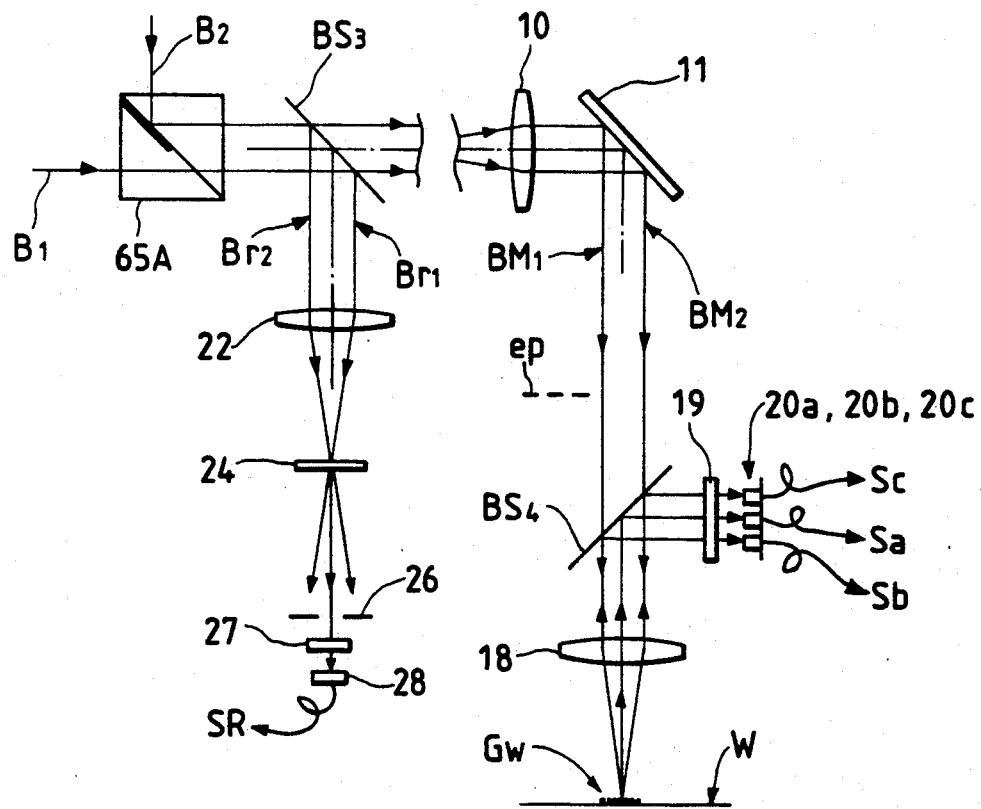
FIG. 9 is a drawing showing a construction of a displacement detector according to a third embodiment of the present invention.

FIG. 9 exemplifies variants of the light sending system and the light receiving system according to a third embodiment of the present invention, wherein the construction before the composite prism 65A is same as FIG. 8. The P polarized beam $B_1$ ($f_0+f_1$) and the S polarized beam $B_2$ ($f_0+f_2$) are divided by a polarization neutral beam splitter $BS_3$, the one is divided into the P polarized beam $Br_1$ and the S polarized beam $Br_2$ to be incident on the lens system 22, which are paralleled to intersect mutually. The reference grating 24 is disposed at the intersecting position, however, since the beams $Br_1$, $Br_2$ are polarized complimentarily, an interference fringes IF is not produced. The ±primary diffracted rays (not interfering here) diffracted by the reference grating 24 and running in the same direction as the optical axis pass through the aperture 26 and an analyzer 27 to be interference rays, and reach the photoelectric element 28 for generating the reference signal SR.

On the other hand, the P polarized beam $BM_1$ and the S polarized beam $BM_2$ having passed through the beam splitter $BS_3$ are incident on the objective lens system 18 by way of the lens system 10, a mirror and a polarization neutral beam splitter $BS_4$. The objective lens system 18 parallels the two beams $BM_1$, $BM_2$ to intersect at the grating Gw on the wafer W. Here, since the direction in which the beams $BM_1$, $BM_2$ are polarized is different, an interference fringe is not produced on the grating Gw. Then, the ±primary diffracted rays generated vertically from the grating Gw return along an optical axis of the objective lens system 18, reflected by the beam splitter $BS_4$, and reach the photoelectric element 20a through an analyzer 19. Similarly, the 0-order and the secondary diffracted rays are also reflected by the beam splitter $BS_4$, and reach the photoelectric elements 20b, 20c through the analyzer 19. The photoelectric elements 20a, 20b, 20c have light receiving planes formed individually on the same semiconductor substrate, and generate the outgoing signals Sa, Sb, Sc individually. The light receiving planes are disposed to coincide (or conjugate) with the pupil of the objective lens system 18. In the light receiving system, the ±primary diffracted rays, or the 0-order and the secondary diffracted rays can be made to interfere with each other by providing the analyzer 19, and the outgoing signals Sa, Sb, Sc are obtainable at a similar beat frequency.

As shown in FIG. 9, the S polarized beam and the P polarized beam are shifted on frequency individually by the two AOM's 56, 57, and the two beams are synthesized eccentrically by the composite prism 65A, then S/N ratio will be enhanced remarkably as compared with the case where coaxial beams of two frequencies are split into two beams when using Zeeman laser beam source.

Next, a fourth embodiment of the present invention will be described with reference to FIG. 10 and FIG. 11. In the fourth embodiment, with the incident angle $\phi$ of the two beams $BM_1$, $BM_2$ as it stands, a pitch of the diffraction grating Gw on the wafer W is reduced to ½ of that of the first embodiment, and further a pitch of the reference grating 24 of the reference system is also reduced to ½.

Figure 10:
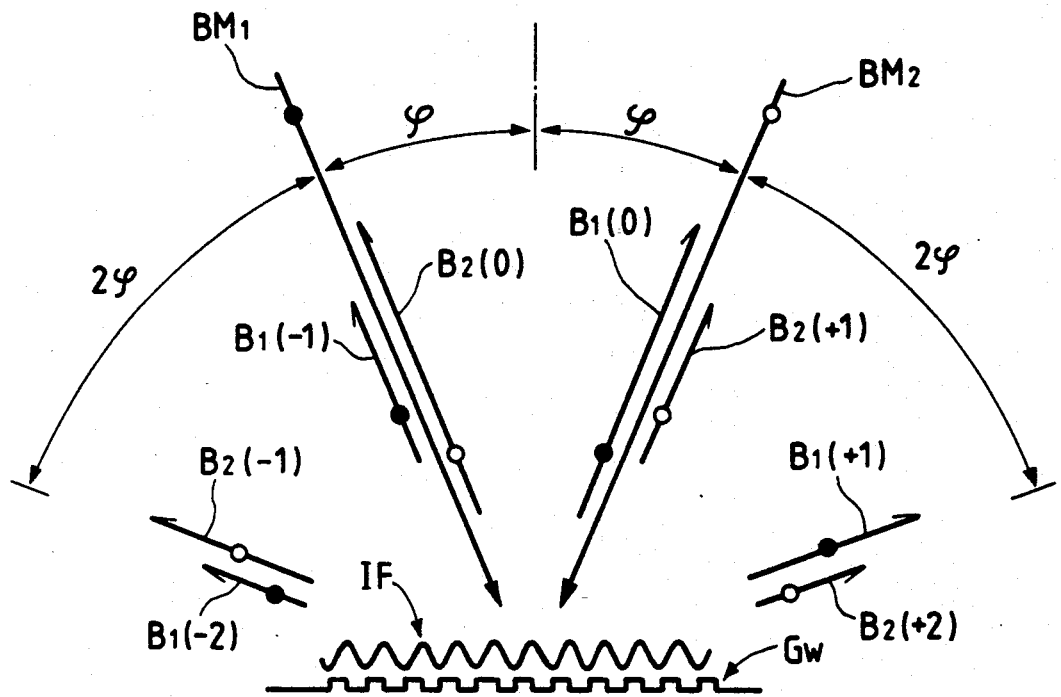
FIG. 10 and FIG. 11 are drawings showing a grating form according to a fourth embodiment of the present invention.
Figure 11:
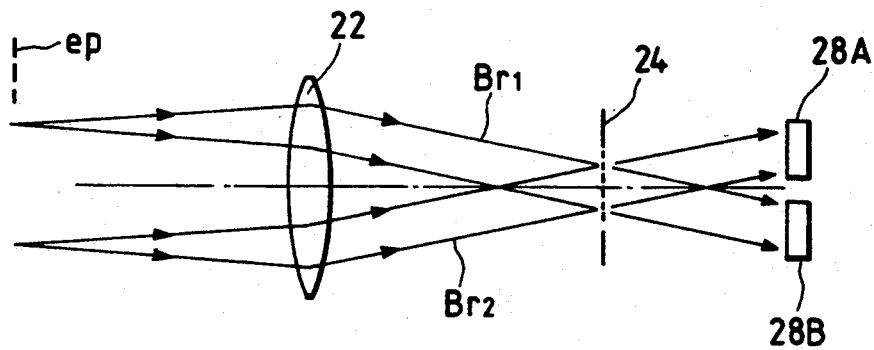

FIG. 10 typically shows how diffracted rays are generated when the pitch of the diffraction grating Gw is reduced to ½. In case an intersecting angle of the two beams $BM_1$, $BM_2$ is $2\phi$, and incident angles are symmetrical, the pitch Pf of the interference fringe IF is, as specified in Eq. (1):

$$Pf = \frac{\lambda}{2 \sin \phi}$$

On the other hand, if a pitch Pg of the diffraction grating Gw is ½ of that of FIG. 2, then Pg=Pf. Accordingly, a diffraction angle to the 0-order ray of the ±primary diffracted rays (n=1) is $2\phi$.

Therefore, +primary diffracted ray $B_1$ (+1), −primary diffracted ray $B_1$ (−1), +secondary diffracted ray $B_1$ (+2), −secondary diffracted ray $B_1$ (−1), ... are generated at every angles ±2 $\phi$ around the 0-order diffracted ray $B_1$ (0) of the first beam $BM_1$, and primary diffracted ray $B_2$ (+1), −primary diffracted ray $B_2$ (−1), +secondary diffracted ray $B_2$ (+2), −secondary diffracted ray $B_2$ (−2), ... are generated at every angles ±2 $\phi$ around the 0-order diffracted ray $B_2$ (0) of the second beam $BM_2$. Where pitches of the interference fringe IF and the grating Gw are equal, the diffracted ray generated vertically from the grating Gw does not exist, as shown in FIG. 10, and the 0-order diffracted ray $B_2$ (0) of the beam $BM_2$ running in the direction counter to the beam $BM_1$ and the −primary diffracted ray $B_1$ (−1) generated by irradiation of the beam $BM_1$ can be detected as coaxial. Similarly, the 0-order diffracted ray $B_1$ (0) and the +primary diffracted ray $B_2$ (+1) run as coaxial, further the +primary diffracted ray $B_1$ (+1) and the +secondary diffracted ray $B_2$ (+2) become coaxial, and the −primary diffracted ray $B_2$ (+1), and the −secondary diffracted ray $B_1$ (−2) become coaxial. Consequently, the interference rays BT (−1, 0) with the 0-order diffracted ray $B_2$ (0) and the -primary diffracted ray $B_1$ (−1) are received straight by the photoelectric element 20b, and the interference rays BT (0, +1) with the 0-order diffracted ray B1 (0) and the +primary diffracted ray $B_2$ (+1) are received straight by the photoelectric element 20c in the detector shown in FIG. 1.

Accordingly, in the case of the present embodiment, the photoelectric signals to be detected are two coming in Sb, Sc, the phase difference $\Delta\theta_2$ from the reference signal SR is obtained according to the circuit block shown in FIG. 6, and the result may be taken to be the displacement $\Delta X$ of the grating Gw.

A similar conception applies exactly to the transmission type reference grating 24, and from equalizing a pitch of the interference fringe produced on the reference grating 24 and a pitch of the grating 24, the 0-order diffracted ray (direct transmitting light) of the beam $Br_1$ and the +primary diffracted ray generated by irradiation of the beam $BM_2$ become coaxial to interfere with each other, received by a photoelectric element 28A, and the 0-order diffracted ray (direct transmitting light) of the beam $BM_2$ and the −primary diffracted ray generated by irradiation of the beam $BM_1$ become coaxial to interfere with each other, and received by a photoelectric element 28B. In this case, a diffracted ray generated vertically from the reference grating 24 does not exist, therefore where an intersecting angle of the beams $Br_1$, $Br_2$ is same as FIG. 1, a distance from the reference grating 24 to the photoelectric elements 28A, 28B is considerably shortened as compared with the case of FIG. 1, thus realizing a compact construction of the reference system.

In this connection, both outgoing signals of the two photoelectric elements 28A, 28B may be synthesized by an electrical analog addition (or subtraction) circuit to be the reference signal SR.

Figure 12:
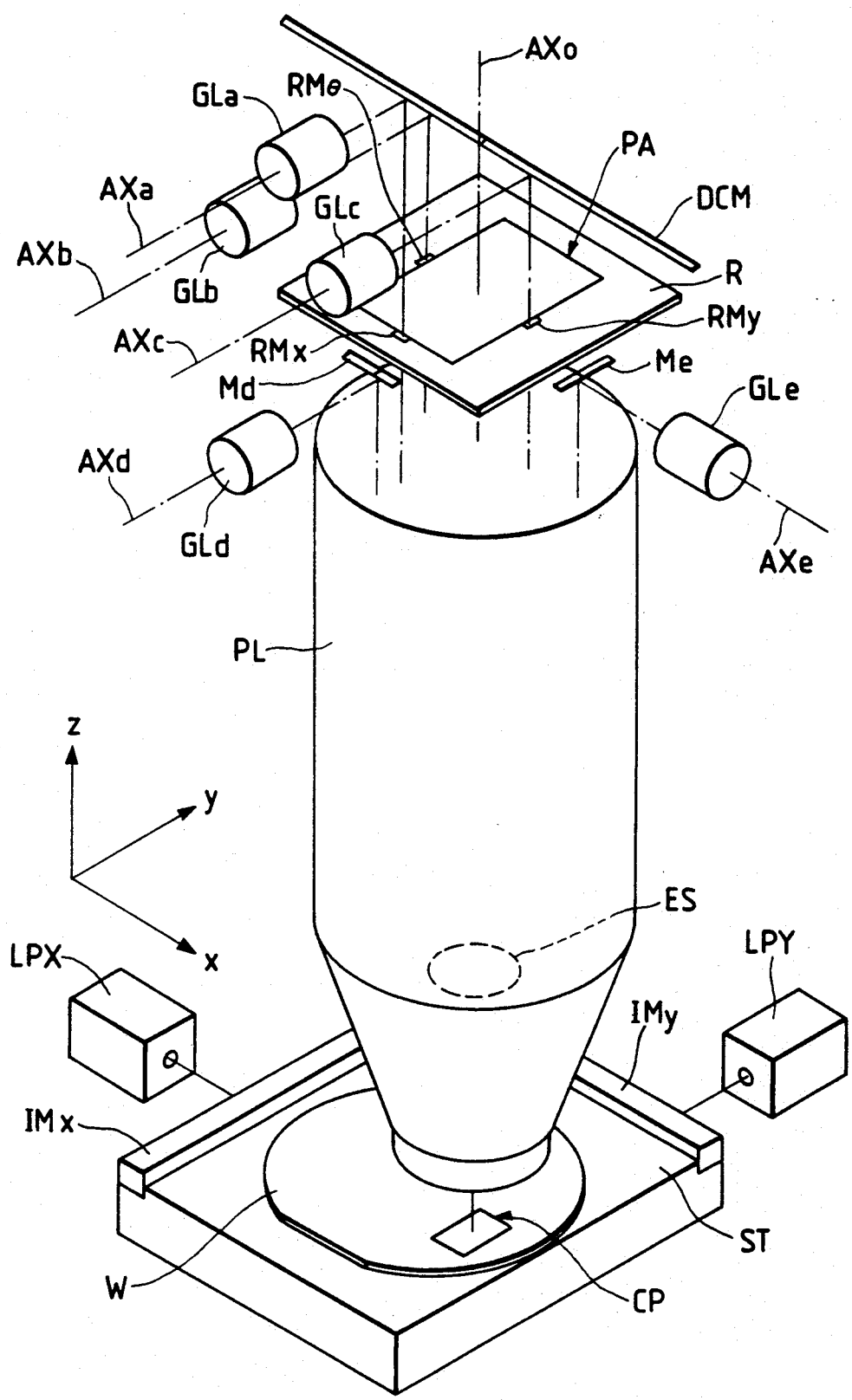
FIG. 12 is a perspective view representing a fifth embodiment of the present invention, showing a projection exposure device with a displacement detection system incorporated therein as alignment system.

A fifth embodiment of the present invention will then be described with reference to FIG. 12. FIG. 12 is a perspective view representing a construction when the displacement detection system of the present invention is utilized as an alignment system (TTR, TTL) for the projection type exposure device of step-and-repeat system.

Figure 13:
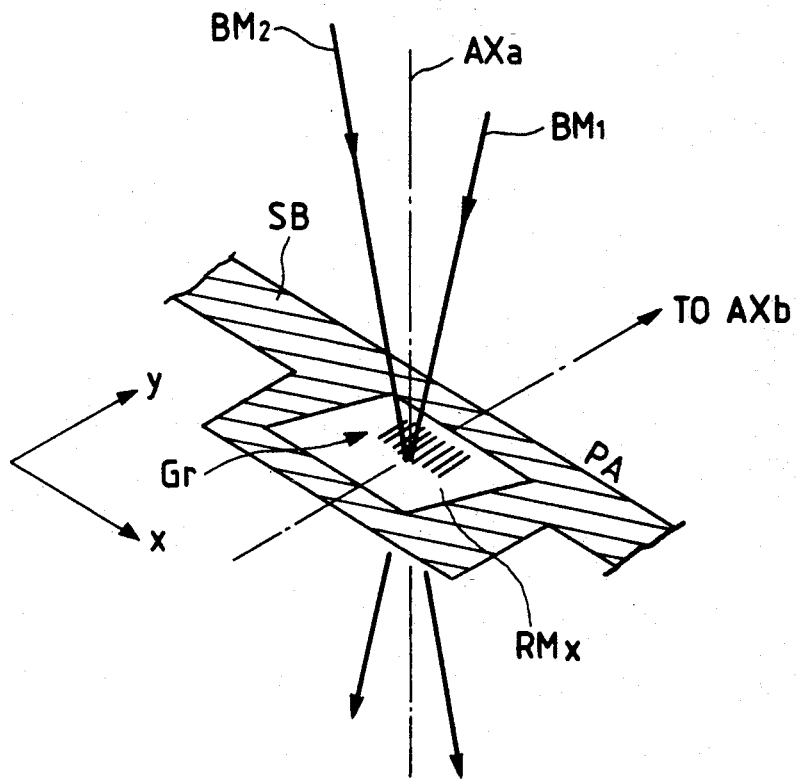
FIG. 13 and FIG. 14 are perspective view for illustrating form and disposition of a reticle grating and a wafer grating used on the device of FIG. 12.

In FIG. 12, a reticle R is provided with a circuit pattern area PA, and mark areas RMx, PMy, RM$\theta$ for TTR (through-the-reticle) alignment. The reticle R is disposed so that an optical axis AXo of a projection lens PL telecentric on opposite sides will pass the center of the pattern area PA. A dichroic mirror DCM slanting at 45° is disposed over the reticle R, and an exposure light is transmitted vertically to illuminate the pattern area PA of the reticle R. Three objective lens systems GLa, GLb, GLc of the TTR alignment system are disposed so as to detect the mark areas RMx, RM$\theta$, RMy of the reticle R respectively by reflection of the dichroic mirror DCM. Here, a reticle grating mark Gr having a pitch in the direction y is formed on the mark areas RM$\theta$, RMy, and a reticle grating mark Gr having a pitch in the direction x is formed on the mark area RMx. The two beams $BM_1$, $BM_2$ are incident on the objective lens systems GLa, GLb, GLc along optical axes AXa, AXb, AXc and intersect on the mark areas RMx, RM$\theta$, RMy. The one mark area RMx is formed as a parallelogrammic window, as shown in FIG. 13, on one part of a shade band SB surrounding the pattern area PA, and the reticle grating mark Gr is formed on one part within the window. The parallelogrammic window is intended for keeping an edge from extending in the direction y orthogonal to a pitch direction (direction x) of the reticle grating mark Gr.

The two beams $BM_1$, $BM_2$ irradiate the overall window of the mark area RMx, and the transmitting lights intersect again on the wafer W through the projection lens PL. Spotlights of the beams $BM_1$, $BM_2$ are positioned on a pupil ES of the projection lens PL symmetrically with reference to the optical axis $AX_0$.

Figure 14:
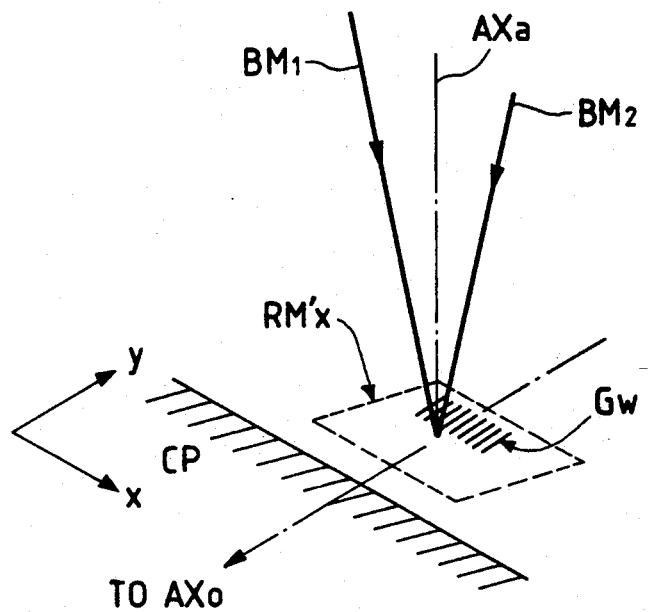

Now, a plurality of chip areas CP are formed on the wafer W, and a projected image of the pattern area PA of the reticle R is superposed accurately on the chip areas CP to exposure. The wafer W is placed on a stage ST moving two-dimensionally, and mirrors IMx, IMy for reflecting laser beams of laser interferometers LPX, LPY are fixed on two sides of the stage ST. On the other hand, the wafer grating mark Gw is formed in the chip area CP on the wafer W correspondingly to the mark area of the reticle R as shown in FIG. 14. The wafer grating mark Gw is provided within a scribed line around the chip area CP, and irradiated by the two beams $BM_1$, $BM_2$. In FIG. 14, RMx' represents a projected image of the mark area RMx in FIG. 13, and the reticle grating mark Gr and the wafer grating mark Gw are located so as to shift in the direction y orthogonal to the pitch direction in the case of FIG. 13 and FIG. 14.

In the case of such TTR alignment system, to avoid an absorption of the resist layer by varying wavelengths of the two beams $BM_1$, $BM_2$ from a wavelength of the exposure light, there may be a case where the beams $BM_1$, $BM_2$ intersect on the reticle R but not on the wafer W (or reversely intersect on the wafer W but not on the reticle R) due to a chromatic aberration of the projection lens PL. Now, therefore, a double focus element (double refraction element) is disposed on each pupil (conjugate with the pupil ES of the projection lens) of the objective lens systems GLa, GLb, GLc as in the case of Japanese Patent Application Laid-open No. 63-283129, further the reticle grating mark Gr is irradiated by a P polarized light component of the two beams $BM_1$, $BM_2$, and the wafer grating mark Gw is irradiated by an S polarized light component of the beams $BM_1$, $BM_2$, then the interference ray from the reticle grating mark Gr and the interference ray from the wafer grating mark Gw can be polarized to a separate detection.

Further as shown in FIG. 12, in TTL (through-the-lens) alignment system wherein small mirrors Md, Me are provided slantwise right under the reticle R, and the grating mark Gw on the wafer W is detected solely through objective lens systems GLd, GLe and the projection lens PL, the grating mark Gw is irradiated by the two beams $BM_1$, $BM_2$ likewise, thereby obtaining a displacement of the grating mark Gw. Then, the TTL alignment system along an optical axis AXd detects the wafer grating mark Gw with the pitch coming in the direction x, and the TTL alignment system along an optical axis AXe detects the wafer grating mark Gw with the pitch coming in the direction y.

These objective lens systems GLa, GLb, GLc, GLd, GLe of each alignment system may be considered as equivalent basically to be objective lens system 18 shown in FIG. 1.

Each embodiment of the present invention has been described as above, however, the present invention is still applicable to the case where the beams $BM_1$, $BM_2$ for irradiating the grating Gw work an a homodyne system free from a frequency difference. In this case, however, the outgoing signals Sa, Sb, Sc are not developed to be AC signals having a constant frequency, but developed to be DC signals changing into a sine waveform (the frequency being proportional to a moving rate of the wafer W) by moving the grating Gw (the wafer W) one-dimensionally.

Figure 15:
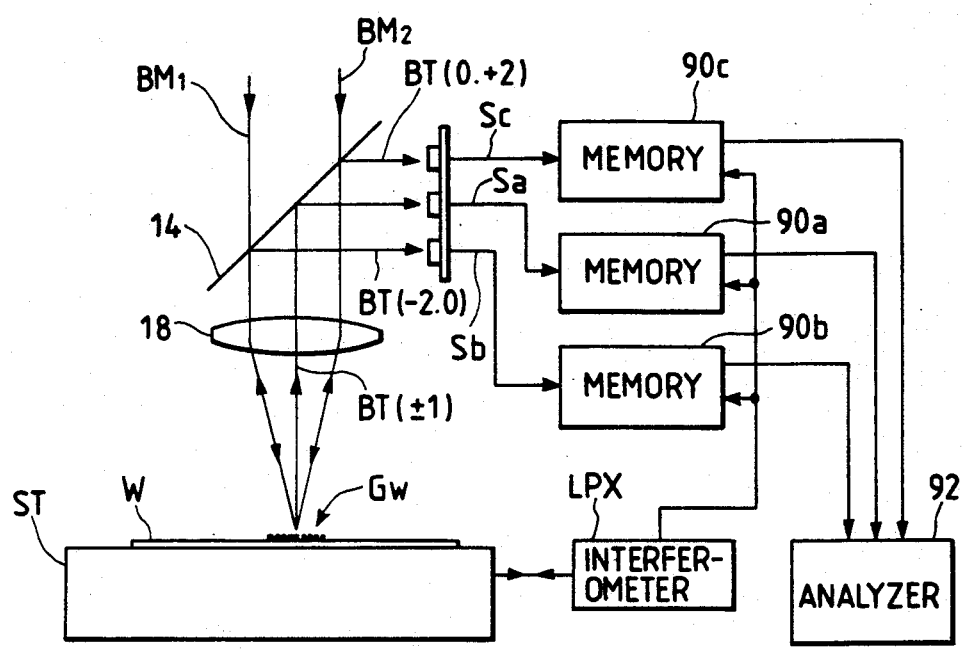
FIG. 15 is a drawing showing a construction of a displacement detector according to a sixth embodiment of the present invention.
Figure 16:
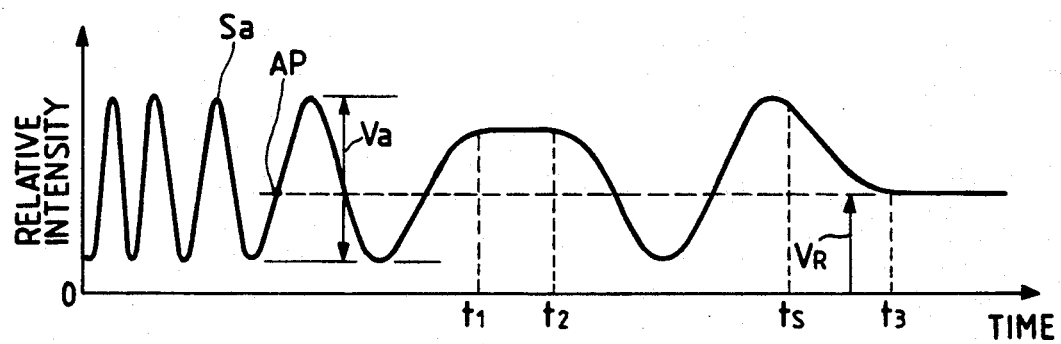
FIG. 16 is a drawing exemplifying a photoelectric signal waveform obtained on the detector of FIG. 15.

FIG. 15 represents a basic construction wherein a displacement detection or an alignment is carried out on the homodyne system, and the particulars will be described as a sixth embodiment. In the case of homodyne system, there is no frequency difference between the two beams $BM_1$, $BM_2$, and the interference fringe on the wafer W is stationary, therefore, the stage ST with the wafer W placed thereon is moved one-dimensionally in the pitch direction of the grating Gw. In this case, the interference rays BT ($\pm 1$) generated vertically from the grating Gw, and the interference rays BT ($-2$, 0), BT (0, $+2$) tracing an optical path reverse to the beams $BM_1$, $BM_2$ change in intensity each according to a relative displacement of the interference fringe and the grating Gw. The outgoing signals Sa, Sb, Sc of each photoelectric detector are inputted to waveform memories 90a, 90b, 90c operating for digital sampling of signal waveforms in response to up-down pulses from the laser interferometer LPX for measuring a position of the stage ST at 0.01 μm resolution. The memories 90a, 90b, 90c each comprise analog-digital converter, RAM, address counter and others. A waveform analyzer 92 judge a magnitude of amplitudes and detects displacement according to each stored signal waveform. FIG. 16 exemplifies the outgoing signal Sa, wherein the axis of abscissa indicates a time and the axis of ordinate indicates a relative intensity value. The stage ST stops moving in one direction at a time $t_1$, however, it is determined to pass slightly a desired positioning point AP of the grating Gw. One period of the outgoing signal Sa corresponds to ½ pitches of the grating Gw here. The memory 90a loads signal waveforms therein before the time $t_1$, and the analyzer 92 detects an amplitude Va thereof. The signals Sb, Sc are loaded in the memories 90b, 90c likewise, and have the amplitudes detected by the analyzer 92. The analyzer 92 judges which outgoing signal to use according to the amplitude value during the period of time $t_1$ to $t_2$ (the stage being stopped) as in the case of first embodiment, and decides a level $V_R$ corresponding to the desired positioning point AP according to a peak value and a bottom value of the amplitude on the signal waveform to use. The stage is returned slowly in the reverse direction thereafter, forced into a distance within $\pm \frac{1}{4}$ pitches of the positioning point AP according to a measured value of the interferometer LPX, and at a time $t_s$ when a slope on the waveform including the point AP appears, a driving motor of the stage ST has the outgoing signal Sa changed to a feedback control with the deviation signal level $V_R$ as a desired value.

The stage ST is thus subjected to a servo control so that the outgoing signal Sa coincides with the level $V_R$, and the positioning is attained after a time $t_3$. Then, when using the outgoing signals Sb, Sc, phases of both the signals will be shifted, therefore a correction must be made in the same point of view as the technique described, for example, in FIG. 5 and FIG. 6. In the case of homodyne system, however, information on displacement is only the level on the outgoing signal waveform, therefore levels (amplitudes) of the two outgoing signals Sb, Sc will be corrected, and also process such as addition averaging or the like will be necessary after the waveform is shifted (address shift) on at least one RAM of the memories 90b, 90c. Such homodyne system may easily be realized by impressing the same driving frequency on the two AOM's 56, 57 shown in FIG. 7. The homodyne system comprises loading in signal waveforms on stage scanning system, thereby obtaining the displacement, therefore, the stage need not be aligned within $\pm \frac{1}{4}$ pitches of a target position and then stopped as in the case of heterodyne system, and thus the position can be detected relatively at high speed. However, change in intensity and fluctuation of the beams $BM_1$, $BM_2$ may lead to an error straight, therefore a peak value and a bottom value of the signal amplitude must be measured immediately before detection of the position.

As described above, according to the present invention, an interference ray of the diffracted rays of an angle of diffraction and an interference ray of the diffracted rays different in angle of diffraction can be used both selectively according to shape error of a diffraction grating, resist thickness and others, therefore the invention may be applied correspondingly to almost all of the objects to be measured (such as wafer and the like).

What is claimed is:

1. A displacement detector comprising:
   beam irradiation means for radiating two beams to a diffraction grating provided on an object from different directions, respectively;
   first detection means for detecting first interference radiation between diffracted rays from said diffraction grating in a first direction and having a first diffraction angle, and for outputting a first photoelectric output corresponding to the first interference radiation;
   second detection means for detecting second interference radiation between diffracted rays from said diffraction grating in a second direction, and having a second diffraction angle, and for outputting a second photoelectric output corresponding to the second interference radiation;
   measuring means having a plurality of selectable algorithms for determining displacement of said object relating to a grating pitch direction of said diffraction grating, by using at least one of the first and the second photoelectric outputs; and
   selecting means for selecting one of said algorithms on the basis of a comparison of intensities of the first and the second photoelectric outputs.

2. The displacement detector of claim 1, wherein said beam irradiation means includes a frequency modulating means for providing a predetermined frequency difference between said two beams, and said displacement detector further comprises a reference signal generating means for generating a reference signal with a frequency equal to the frequency difference;
   said first photoelectric detection means and said second photoelectric detection means generate said first and second photoelectric outputs, respectively, with a frequency equal to said predetermined frequency difference; and
   said measuring means includes a first phase detecting means for producing a first phase output indicating a phase relation between said reference signal and said first photoelectric output and a second phase detecting means for producing a second phase output indicating a phase relation between said reference signal and said second photoelectric output.

3. The displacement detector of claim 2 wherein said irradiation means comprises:
   a beam splitter for dividing one parallel ray beam into said two beams; and said frequency modulating means includes a frequency shifter for shifting the frequency of each of the two beams.

4. The displacement detector of claim 1, wherein said selecting means includes means for detecting amplitude values of the first and the second photoelectric outputs and selects one of said algorithms on the basis of a detected amplitude value.

5. The displacement detector of claim 1, wherein said first detection means has a first light receiving element for detecting an interference radiation intensity of +K-order diffracted rays produced from said diffraction grating by radiation of one of said two beams, and -K-order diffracted rays produced from said diffraction grating by radiation of the other of said two beams;

said second detection means has a second light receiving element for detecting an interference radiation intensity, with m as an integer, of +(K+m)-order diffracted rays produced from said diffraction grating by radiation of said one beam and −(K−m)-order diffracted rays produced from said diffraction grating by radiation of said other beam, and a third light receiving element for detecting an interference radiation intensity of +(−m)-order diffracted rays produced from said diffraction grating by radiation of said one beam and −(K+m)-order diffracted rays produced from said diffraction grating by radiation of said other beam.

6. A displacement detector of claim 1, wherein said algorithms comprise:

a first algorithm for determining a displacement of said object on the basis of one of the first and the second photoelectric outputs, an intensity of the selected one being stronger than the other;

a second algorithm for determining a displacement of said object on the basis of the second photoelectric output when an intensity of the first photoelectric output is less than a predetermined value; and a third algorithm for weighting the first and the second photoelectric outputs on the basis of intensities thereof to determine a displacement of said object to be measured on the basis of the result of weighting.

7. A projection type exposure device, comprising:

a moving device capable of moving an object; and a displacement detector for detecting a displacement deviation of said object;

said displacement detector comprising beam irradiation means for radiating two beams to a diffraction grating provided on said object from different directions, respectively;

first detection means for detecting first interference radiation between diffracted rays from said diffraction grating in a first direction and having a first diffraction angle, and for outputting a first photoelectric output corresponding to the first interference radiation;

second detection means for detecting second interference radiation between diffracted rays from said diffraction grating in a second direction, and having a second diffraction angle, and for outputting a second photoelectric output corresponding to the second interference radiation;

measuring means having a plurality of selectable algorithms for determining displacement of said object relating to a grating pitch direction of said diffraction grating, by using at least one of the first and the second photoelectric outputs; and selecting means for selecting one of said algorithms on the basis of a comparison of intensities of the first and the second photoelectric outputs.

* * * * *